United States Patent
Boutry et al.

(10) Patent No.: US 11,742,234 B2
(45) Date of Patent: Aug. 29, 2023

(54) SYSTEM FOR POSITIONING A PLATE

(71) Applicant: COMMISSARIAT A L'ENERGIE ATOMIQUE ET AUX ENERGIES ALTERNATIVES, Paris (FR)

(72) Inventors: Delphine Boutry, Grenoble (FR); Delphine Autillo, Fontaine (FR); Virginie Enyedi, Grenoble (FR); Grégory Enyedi, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/331,852

(22) Filed: May 27, 2021

(65) Prior Publication Data
US 2021/0375660 A1 Dec. 2, 2021

(30) Foreign Application Priority Data
May 29, 2020 (FR) ...................................... 20 05725

(51) Int. Cl.
*H01L 21/683* (2006.01)
*B65G 1/04* (2006.01)

(52) U.S. Cl.
CPC ............ *H01L 21/6838* (2013.01); *B65G 1/04* (2013.01)

(58) Field of Classification Search
CPC ........... H01L 21/6838; H01L 21/68785; H01L 21/68707; H01L 21/68735; B65G 1/04; B23Q 7/1431
USPC ............ 414/222.03, 222.04, 222.05, 222.06
See application file for complete search history.

(56) References Cited

U.S. PATENT DOCUMENTS

| | | | | |
|---|---|---|---|---|
| 3,825,245 A | * | 7/1974 | Osburn | B23Q 7/1431 198/465.1 |
| 4,842,680 A | * | 6/1989 | Davis | H01L 21/68785 156/345.31 |
| 5,145,048 A | * | 9/1992 | Kitamura | B23Q 7/1431 198/465.1 |
| 5,692,873 A | | 12/1997 | Weeks et al. | |

(Continued)

FOREIGN PATENT DOCUMENTS

FR 3 091 009 A1 6/2020
WO WO 2008/018731 A1 2/2008

OTHER PUBLICATIONS

U.S. Appl. No. 16/719,598, filed Dec. 18, 2019, 2020/0203190 A1, Autillo, D, et al.

(Continued)

*Primary Examiner* — Glenn F Myers
(74) *Attorney, Agent, or Firm* — Oblon, McClelland, Maier & Neustadt, L.L.P.

(57) ABSTRACT

System for positioning (DP) a plate handling device relative to a plate of a given shape, said device including a securing face (8) for being secured to a face of the plate:
a tray (16) comprising a face for facing a face of the plate,
a support (18) supporting the tray,
pins (32) protruding from the face of the tray (16) and delimiting the external shape of the plate between them,
a housing (28) in the tray (16) for mounting the handling device so that said securing face (8) of the handling device is oriented to the side of the face of the tray (16), the position of the housing (28) relative to the pins (32) ensuring positioning of the device relative to the plate.

17 Claims, 4 Drawing Sheets

(56) References Cited

U.S. PATENT DOCUMENTS

| | | | |
|---|---|---|---|
| 6,191,053 B1 * | 2/2001 | Chun | G03F 7/16 |
| | | | 438/782 |
| 6,293,749 B1 | 9/2001 | Raaijmakers et al. | |
| 6,413,459 B1 * | 7/2002 | Anderson | H01L 21/68707 |
| | | | 414/941 |
| 2005/0284369 A1 * | 12/2005 | Miya | H01L 21/6838 |
| | | | 118/500 |
| 2017/0219504 A1 * | 8/2017 | Volz | B25B 11/005 |
| 2020/0043756 A1 | 2/2020 | Rangarajan et al. | |
| 2020/0203190 A1 | 6/2020 | Autillo et al. | |

OTHER PUBLICATIONS

French Preliminary Search Report dated Mar. 1, 2021 in French Application 20 05725 filed on May 29, 2020, 2 pages (with English Translation of Categories of Cited Documents).

* cited by examiner

SYSTEM FOR POSITIONING A PLATE

TECHNICAL FIELD AND STATE OF PRIOR ART

The present invention relates to a system for positioning a plate and for positioning a device for handling this plate.

In the field of microelectronics, substrates or wafers are used on which electronic circuits are made. But contaminants, such as metal elements, even in trace form, can lead to a reduction in electrical performance. This contamination can occur at any step of manufacturing electronic circuits on a substrate, for example of silicon. Contamination, especially on the backside or wafer or bevel, can be caused by devices used to handle substrates, for example, grippers or equipment used to transfer substrates from one box to another, known as "sorters", or substrate storage boxes.

In order to limit contamination risks of the plate edges, a vacuum chuck is used. The vacuum chuck has a cavity which can be connected to a vacuum source, which is brought into contact with one face of the plate, vacuum is generated in the cavity, the plate is then secured to the chuck and can be moved without coming into contact with the edge of the plate.

Document FR1873425 filed on 19 Dec. 2018 describes a plate edge contaminant collection device comprising a support on which is mounted the substrate capable of rotating about a horizontal axis and a trough containing a collection liquid and receiving part of the plate edge. The substrate is vertically supported by a vacuum chuck. By rotating the substrate about itself, the entire edge of the substrate is swept by the liquid in the trough. This technique requires very good centring of the handling device relative to the substrate in order to ensure a substantially constant collection height at the edge of the substrate over the entire periphery of the plate.

Furthermore, in a method for bonding two plates, aligning the two plates is required. However, this aligning can be complex to achieve, especially due to the stresses upon handling the plates.

DISCLOSURE OF THE INVENTION

It is therefore a purpose of the present invention to solve the above-mentioned drawbacks.

The above stated purpose is achieved by a system for positioning a plate handling device relative to a face of a plate, comprising a tray, means for positioning the plate relative to the tray, a housing for mounting the handling device, said housing being located relative to the positioning means so that when the handling device is positioned in the mounting housing and the plate edge is in contact with the positioning means, the handling device is properly positioned relative to a face of the plate.

The handling device has a face able to contact a face of the plate to be secured thereto, and which is configured to cooperate with the housing of the positioning system so that the face of the handling device is immobilised relative to the tray and is on the side of the face of the tray receiving the plate.

The positioning system implements an intermediate system in which the plate is in a given position and the handling device has a given position. As a result, the handling device has a given position relative to the plate.

By virtue of the invention, the positioning of the handling device relative to the plate is always proper.

In a very advantageous example, the positioning system is designed to limit the steps of handling the plate.

Preferably, the positioning elements include at least three pins with which the plate contour is to be in contact. Contact between the plate and the positioning system is then reduced.

Very advantageously, the pins are removable and can be easily cleaned to further limit contamination of the plate edge.

The positioning system can very advantageously be implemented in a substrate bonding device.

One subject-matter of the present application is then a positioning system for positioning a plate handling device relative to a plate of a given shape, said handling device having a securing face for being secured to a face of the plate, said system comprising:
  a tray comprising a first face and a second face, the second face being to face at least partly a face of the plate,
  a support supporting the tray,
  positioning elements for positioning the plate relative to the tray, said positioning elements being carried by the second face of the tray,
  a housing for mounting the handling device in the tray, so that said securing face of the handling device is oriented to the side of the second face of the tray, the position of the housing relative to the positioning means ensuring positioning of the handling device relative to the plate.

The housing preferably opens into the contour of the tray to allow the handling device to be placed and removed.

Very advantageously, the positioning system comprises means for raising the plate carried by the handling device relative to the tray.

Advantageously, at least the positioning elements are made of polytetrafluoroethylene. Preferably both the positioning system and the handling device are of polytetrafluoroethylene.

Another subject-matter of the present application is a handling assembly comprising a positioning system according to the present application and a handling device including a body, a head fitted with a securing face, the head being configured so that the securing face is oriented to the side of the second side of the tray and the body is on the other side of the tray relative to the securing face.

According to an additional characteristic, the head of the handling device has dimensions greater than the transverse dimension of the housing, and the head is connected to the body by a joining portion with transverse dimensions less than the transverse dimension of the housing, so that the head can rest on the second face of the tray and the joining portion can slide in the housing.

According to an additional characteristic, the handling device comprises at least one channel opening into the securing face and connected to a low pressure source.

Preferably, the securing face includes grooves connected to the channel.

For example, the securing face comprises first grooves in concentric circles with different diameters and at least one second rectilinear groove arranged radially and crossing the first grooves, said first grooves and said at least second groove being connected to the channel.

Another subject-matter of the present application is an assembling system for assembling two plates comprising two handling assemblies according to the present application, said system being advantageously configured to assemble two disc-shaped plates each comprising a flat or a notch on its contour, the positioning elements of at least one positioning system being such as to require locating the flat or the notch on the tray.

Another subject-matter of the present application is a method for assembling a first and a second plate implementing the assembling system according to the present application, comprising:

Placing the first and second handling devices in the first and second positioning systems respectively.

Placing the first and second plates on the first and second positioning devices respectively.

Securing the first and second plates to the first and second handling devices respectively.

Removing the second handling device and the second plate from the second positioning device, Bringing the second plate closer to the first plate.

Bringing the first and second plates into contact with each other through the face opposite to that in contact with the first and second handling devices.

BRIEF DESCRIPTION OF THE DRAWINGS

The present invention will be better understood based on the following description and the appended drawings in which.

DETAILED DISCLOSURE OF PARTICULAR EMBODIMENTS

The present invention is of particular interest in the field of microelectronics.

The example of a disc-shaped plate, which is the shape of substrates or wafers used in microelectronics, will be more particularly described in the description but the invention is applicable to plates of any, for example rectangular, shapes.

Figure 2A:
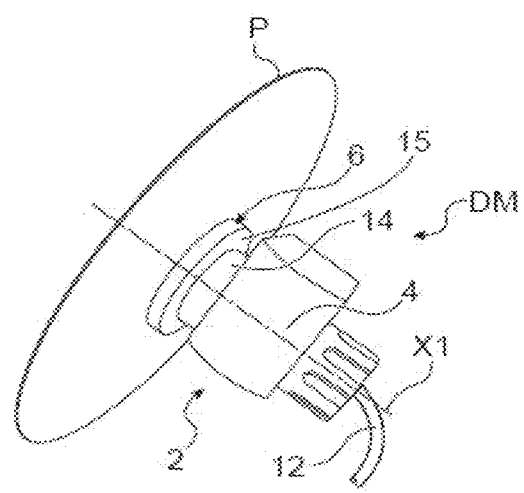
FIG. 2A is a perspective view of an example of a handling device for cooperating with the positioning system, a plate being secured to the handling device.

In FIG. 2A, an example of a handling device DM specially adapted to cooperate with the positioning system DP, which enables the handling device DM to be secured at a given location on the plate P, can be seen.

Figure 2B:
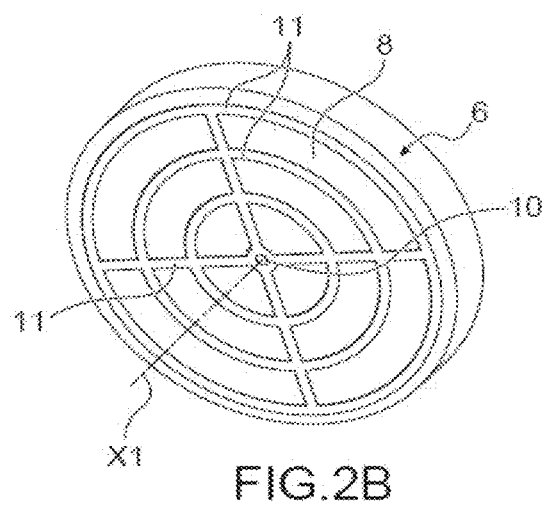
FIG. 2B is a view of the securing face of the handling device of FIG. 2A according to an exemplary embodiment.
Figure 3:
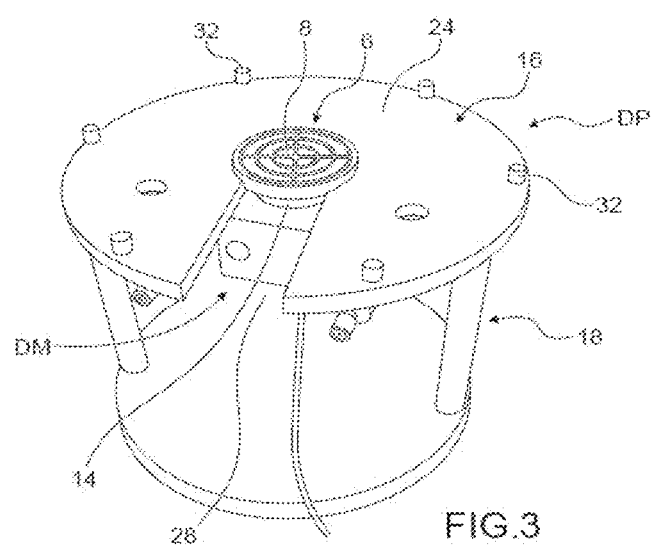
FIG. 3 is a perspective view of the handling device of FIG. 2A mounted in the positioning system of FIG. 1.
Figure 4:
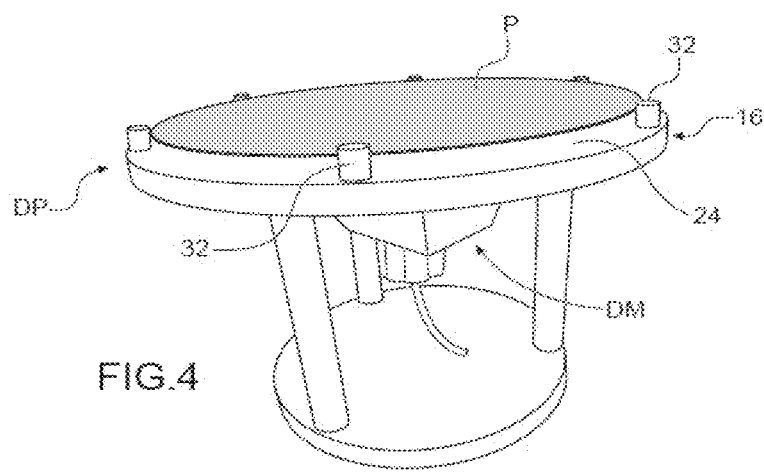
FIG. 4 is a side view of the positioning system and the handling device, with a plate being placed.

The handling device DM comprises a body 2 fitted with a part 4 for gripping the device and a head 6 connected to the body having a face 8 (see FIG. 2B) for coming into contact with a face of a plate P and to be secured thereto. The face 8 of the handling device DM will be referred to as the "securing face". A channel opens into the securing face 8 via a hole 10. The channel is for being connected to a vacuum source, such as an air pump. Advantageously, the securing face 8 includes radial grooves and concentric grooves 11 connected to the hole 10, allowing the low pressure to be distributed over the entire face 8 (FIG. 2B). Alternatively, the face includes several holes for being connected to a vacuum source. The device is connected to a vacuum source through a pipe 12. Alternatively, the device comprises a small vacuum pump integrated directly into the body, or attached thereto, making the DM device even more handleable.

The head 6 has the shape of a disc with axis X1 and is connected to the body 2 by a joining portion 14 with a diameter smaller than that of the head, thus providing a shoulder 15 with the head 6.

Figure 1:
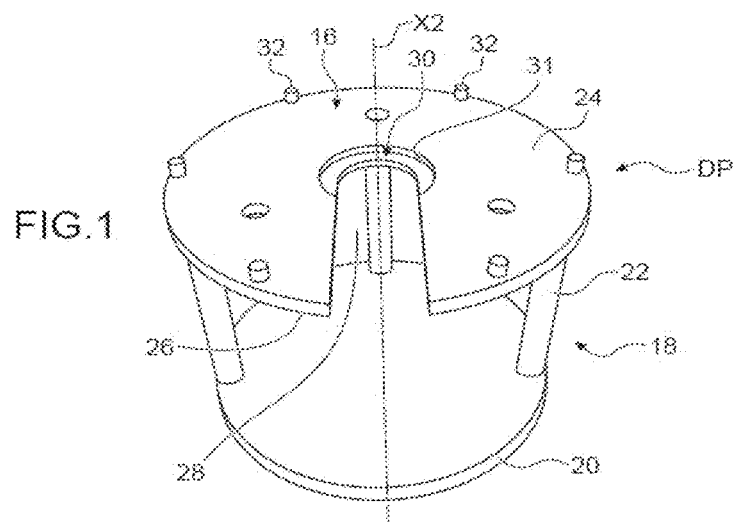
FIG. 1 is a perspective view of an example of a system for positioning a plate handling device.

The positioning system DP, visible in FIG. 1, comprises a disc-shaped tray 16 with axis X2 supported by a support 18. In the example represented, the support 18 is a tripod comprising a stand 20 and three pillars 22 connecting the tray 16 and the stand 20. It will be understood that the number of pillars is not restrictive, the system DP could comprise only one pillar having a shape allowing system balance in the presence of the handling device DM and a plate P. This arrangement has the advantage of offering great stability to the device, especially it limits toppling risks, especially in comparison with a stand 20 having two pillars 22. Alternatively, it can be contemplated not to use a stand, while retaining the pillars 22.

The height of the pillars is chosen to allow the body 2 of the handling device DM to be housed under the tray 16, as will be described below.

The tray 16 has an upper face 24 and a lower face 26, the lower face 26 facing the stand 20. The tray 16 does not form a complete disc and includes a housing 28 adapted to receive the handling device DM. In the example represented, the housing 28 is configured such that the securing face 8 of the handling device DM protrudes from the upper face 24 of the tray 16.

The housing 28 is formed by a notch. According to the example illustrated, the notch is oriented substantially radially. The housing 28 opens into the external contour of the tray 16 and extends up to a central part of the tray. The notch has a bottom located in the central part of the tray so as to define the housing 28.

In this example, the positioning system DP is for positioning the centre of the securing face 8 at the centre of the tray 16 and at the centre of the plate P, in order to superimpose the centre of the plate P with the centre of the securing face 8.

The handling device DM can be introduced into the housing 28. The transverse dimension of the housing 28 is such that it allows the joining portion 14 to slide into the housing 28.

Advantageously, the tray 16 comprises immobilising means 30 for immobilising the device DM relative to the tray 16. In this example, the tray 16 comprises a groove 31 bordering the bottom of the housing 28, the groove 31 being configured to house the head 6 of the device. More particularly, the groove is externally delimited by a circle the diameter of which is substantially equal to the external diameter of the head, so as to enable the head to be housed in the groove 31, while being immobilised in the plane of the tray, and thus ensure its position relative to the tray. Thus, the groove 31 has a shape complementary to the shape of the head 6 of the device DM.

Advantageously, the positioning system includes means for raising the plate relative to the tray, so as to avoid contact between the lower face of the plate P and the tray. The tray is configured to receive the handling device in this raised position. In this example, the raising means are formed by the groove 31, the depth of which, i.e. its dimension in a direction normal to the tray, is less than the thickness of the tray and than the thickness of the thickness of the head 6 so that the securing face 8 of the head 6 protrudes from the upper face of the tray 16 by a non-zero height h, which avoids contact between the lower face of the plate P and the upper face 24 of the tray 16, thus reducing contamination risks.

Alternatively, the groove is such that the securing face 8 of the handling device DM is substantially in the same plane as the free face of the tray. This results in significant contact between the tray and the plate.

Alternatively, a groove also borders the part of the housing 28 extending to the outer edge of the tray, this groove having a depth equal to that of groove 31 or different from that of groove 31.

For example the housing is made by cutting the tray and the groove is made by machining.

The positioning system DP also includes elements for positioning the plate P in a given position relative to the tray 16 and thus relative to the housing 28, which ensures that the handling device DM is in the desired position relative to the plate P before it is secured thereto.

In this example, the positioning elements comprise pegs or pins 32 distributed on the external contour of the upper face 24 of the tray 16 along a circle or any other complementary shape of the plate P. The external contour of the plate P is to come in contact with a side surface of each pin 32, said side surface being oriented towards the centre of the circle or any other complementary shape formed by the set of pins 32 on the tray 16.

In the example represented, the pins 32 are shaped as a cylinder of revolution. The pins 32 are then disposed so that they define between them a circle with a diameter corresponding to the external diameter of the plate P.

In the example represented, when the plate P is housed between the pins 32, it rests at its centre on the securing face 8 of the device DM.

In this example, six pins 32 are implemented. The system preferably comprises at least three pins.

Advantageously, the pins 32 are removable from the tray to allow cleaning thereof. For example, the tray has recesses with a diameter equal to the external diameter of the pins, each recess receiving one end of a pin.

According to another example, the pins have a conical or frustoconical shape with the base in contact with the tray. The pins are then disposed so that they define between them a circle with a diameter corresponding to the external diameter of the plate, so that when the plate is disposed between the pins, it bears against the side face of each of the pins through its radially external contour. In the configuration in which the securing face 8 of the handling device DM protrudes from the upper face of the tray 16, the plate P is positioned between the pins 32, it is located at a height h above the upper face of the tray 16. The distance between the securing face 8 of the handling device DM and the upper face 24 of the tray 16 is at most equal to the height h. A clearance can indeed be provided between the securing face 8 of the handling device DM and the plate P, this clearance being suppressed during suction.

The implementation of conical or frustoconical pins has the advantage of making the positioning system compatible with several plate diameters.

Advantageously, the positioning system as well as the handling device are made of a material that is easy to clean, for example the positioning system is made of polytetrafluoroethylene, for example marketed under the brand name Teflon®. The melting temperature of polytetrafluoroethylene is 327° C., which makes the positioning system as well as the handling device made of such a material not adapted for use in a substrate etching reactor.

The positioning system and/or the handling device may be made entirely of the same material or may be made of several materials.

Alternatively, the pins are replaced by an annular or rectangular frame having the shape and external dimensions of the plate. In this alternative, the contact surface between the plate and the positioning system is increased.

The use of the positioning system will now be described for the purpose of attaching the handling device to the centre of a circular plate P which can be implemented in microelectronics, and for which it is desired to limit contamination during the step of positioning and attaching the handling device to the plate P. The plate P is, for example, a substrate made of semiconductor material intended for the manufacture of printed circuits, for example.

Firstly, the pins 32 are conditioned in order to avoid potential contamination of the external contour or bevel of the plate. For this, the pins are removed from the tray and conditioned with solutions for collecting standard metals and noble metals.

The pins are then placed back on the tray 16.

The handling device DM is placed into the housing 28. The joining portion 14 slides into the housing 28 until it abuts against the bottom of the housing 28, in the case represented, in the centre of the tray 16. The head 6 is then vertically aligned with the groove 31, the head is then lowered and is housed into the groove 31. The securing face 8 is then centred relative to the tray 16 and the pins 32 and is immobilised in the plane of the tray 16. In this example, the securing face 8 protrudes from the upper face of the tray 16.

The plate P is then placed between the pins 32 so that it is shimmed against the pins 32 and thus centred relative to the tray 16. For this, the plate has, for example, been handled with a vacuum pipette which has been cleaned beforehand.

The handling device DM is supplied with a vacuum, which results in securing the securing face 8 and the plate P.

The plate P can then be handled via the handling device DM, which can be removed from the positioning system DP.

To remove the handling device from the positioning system, the handling device DM is moved upwards along axis X2 to release the head 6 from the groove 31 and then slid in the housing 28 outwards to remove the handling device from the positioning system. The operator is then free to handle/transport the plate for example for collection of contaminants from the edges and bevel of the plate or for assembly with another plate as will be described below.

Separation of the plate P from the handling device DM is achieved by venting the interface between the handling device DM and the plate P.

A device for collecting contaminants from the edges and wafer of a disc-shaped substrate will now be briefly described.

Figure 5:
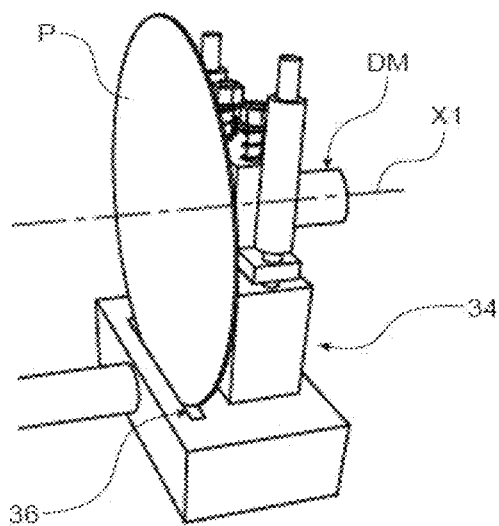
FIG. 5 is a perspective view of a contaminant collection device on a substrate implementing the handling device.

In FIG. 5 a device for collecting contaminants on a substrate in which the handling device is implemented can be seen.

The collection device comprises a support 34 for the substrate so that it can rotate about its axis of revolution, a groove 36 for holding a collection liquid, the groove 36 being located relative to the support 34 so that at least the wafer or a portion of the edges of both faces and the wafer of the substrate enter the groove and contact the collection liquid.

The substrate is mounted in the collection device via the handling device, the latter being mounted on the support 34 so as to be rotatable about a horizontal axis.

The handling device DM forms the axis of rotation of the substrate. It is therefore important that the handling device is in the centre of the substrate, so that the collection width at the edges of the plate is the same over a whole circumference of the substrate, in order to know the collection surface area and thus be able to calculate the concentration of collected elements, knowing the collection surface area and the amount of contaminants collected by the liquid in the groove.

By virtue of the invention, such a very precise positioning of the handling device relative to the plate is made possible in a simple and rapid manner while limiting contamination risks.

Figure 6:
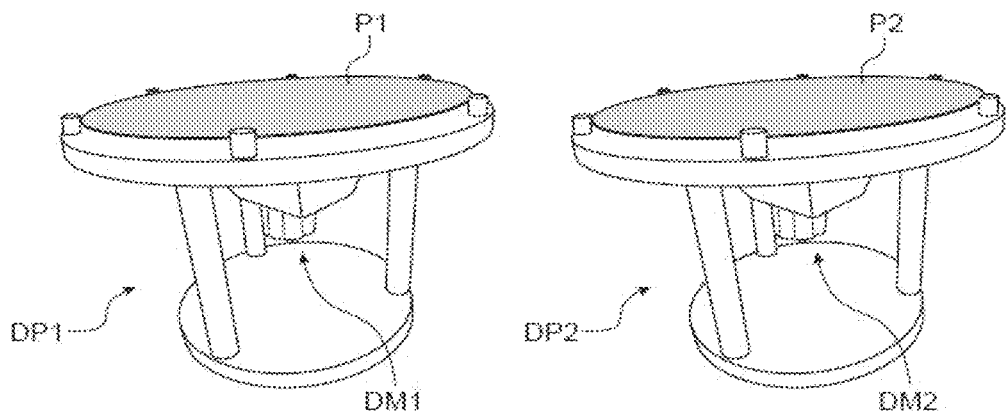
FIG. 6 is a perspective view of a plate bonding assembly including two positioning devices and two handling devices.
Figure 7:
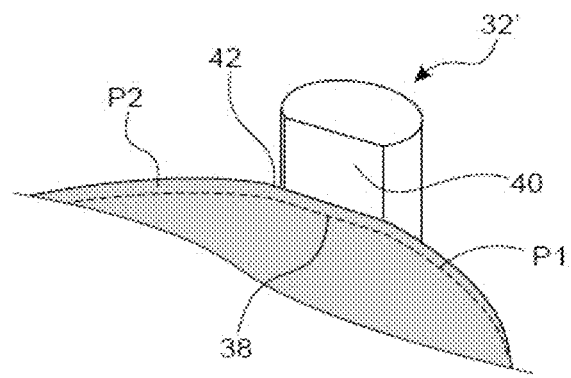
FIG. 7 is a detail view of one of the positioning devices.
Figure 8:
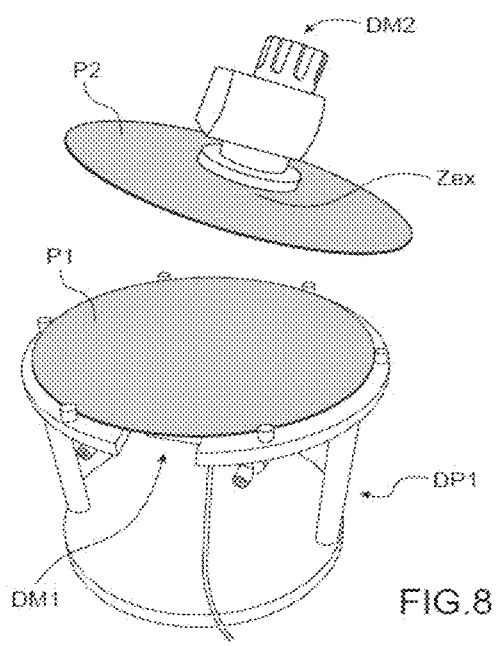
FIG. 8 is a perspective view of a step of bonding two plates implementing the bonding assembly of FIG. 6.

In FIGS. 6 to 8, another example of the use of the positioning system for molecular bonding between two plates, in particular substrates implemented in microelectronics, for example two plates made of Si/SiO2, Au/Au, Ti/Ti, SiO2/LNO, SiO2/LTO, LNO/LNO, LTO/LTO . . . can be seen. The materials ensuring molecular bonding can be the material of which the plates are made, or only that of a front face layer such as Au, Ti . . . .

Molecular bonding is understood as molecular adhesion bonding in which two flat surfaces adhere to each other without the application of adhesive between both surfaces.

In this example, two positioning devices DP1 and DP2 are implemented.

In this example, the positioning devices are such that the securing of the handling device DM1, DM2 to the plate takes place in a zone Zex off-centred from the plate.

In this particular example, at least one of the positioning devices further allows each plate to be specifically oriented.

Circular plates used in microelectronics generally include a flat or notch on their external contour. In FIG. 7, the plates P1, P2 each have a flat 38, 42 respectively.

At least the positioning system DP1 carrying the plate P1 comprises means for locating the flat 38 on the tray 16. In the example represented in FIG. 7, one of the pins 32' also has a flat 40 in its side face against which the flat 38 of the plate is to bear.

To each positioning system DP1, DP2, a handling device DM1, DM2 is mounted. Each handling device is introduced into the housing and is immobilised in the end 28.2 of the housing 28.

A plate P1 is disposed between the pins 32 bearing on the securing face of the handling device DM1, and the flat 38 bearing against the flat 40 of the pin 32'.

A plate P2 is disposed between the pins 32 bearing on the securing face of the handling device DM2, the location of the flat 42 is not necessarily controlled.

The securing face of each handling device DM1, DM2 is connected to the vacuum ensuring securement of the handling device at a given location on each plate P1, P2.

The operator leaves one of the plates in position on the positioning system, for example plate P1, and removes plate P2 from its positioning system by means of the handling device DM2, as explained above, and places the free face of plate P2 facing plate P1 while positioning flat 42 of plate P2 against flat 40 of the pin of the positioning system, so that flat 38 of plate P1 is superposed with flat 42 of plate P2.

In the case of a plate fitted with a notch, a pin includes a radial protrusion for being housed into the notch.

The operator lowers the plate P2 to bring the two free faces of the plates P1 and P2 into contact (FIG. 8).

In the examples described above, a positioning system is configured to ensure given positioning of a handling device relative to the plate. In another example, it can be contemplated that the positioning system can allow for different positioning, for example the radial extension of the housing 28 could be changed to change position of the handling device relative to the plate. For example, a set of shims may be provided, the shims being mounted into the housing in order to change the location where the handling device is mounted in the tray.

Figure 9:
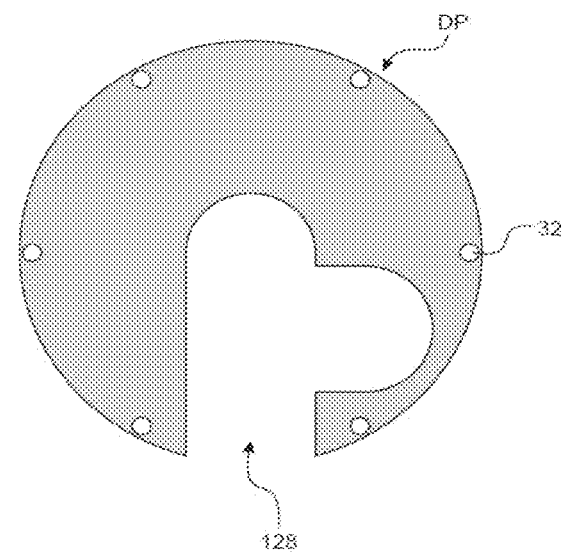
FIG. 9 is a top view of another example of a positioning system.

In FIG. 9, an example of a housing 128 can be seen, allowing the head of the handling device to be centred on the plate, or said head to be positioned off-centre, for example for bonding purposes.

In one advantageous example, it can be contemplated to use the same positioning system for different plate sizes. For example, a tray is provided, the external dimensions of which allow the pins to be positioned in such a way as to receive a first plate with the largest dimensions desired to be handled. This tray includes sets of recesses in its face for facing the plate to be handled, these recesses being configured to receive one end of a pin and the pins in each set being disposed relative to each other so as to define a location for a plate with smaller external dimensions than those of the first plate.

For example, where the plates to be handled are circular, the sets of recesses are concentric.

Thus the positioning system is easily adaptable to several plate sizes.

In the examples described, the positioning system comprises a horizontal tray. Nevertheless, positioning devices with trays tilted to the horizontal or even with trays which are almost vertical do not depart from the scope of the invention.

The invention claimed is:

1. A positioning system for positioning a plate handling device relative to a plate of a given shape, said handling device having a securing face to be secured to a face of the plate, said system comprising:
    a tray comprising a first face and a second face, the second face being to face at least partly a face of the plate,
    a support supporting the tray,
    positioning elements for positioning the plate relative to the tray, said positioning elements being carried by the second face of the tray,
    a housing for mounting the handling device in the tray, so that said face for securing the handling device is oriented to the side of the second face of the tray, the position of the housing relative to the positioning elements ensuring positioning of the handling device relative to the plate, said housing opening into an external contour of the tray so as to allow the handling device to be placed in the housing and the handling device to be removed from the housing,
    wherein said housing opens in a radial direction to the external contour of the tray such that said trey does not form a complete disc.

2. The positioning system according to claim 1, wherein the positioning elements are configured to contact an external contour of the plate so as to form a translational abutment for the plate in a plane parallel to that of the second face of the tray or in a same plane as that of the second face of the tray.

3. The positioning system according to claim 2, wherein the positioning elements comprise at least three pins protruding from the second face of the tray and disposed relative to each other so as to delimit the external contour of the plate between them.

4. The positioning system according to claim 1, wherein the tray comprises an opening defining the housing for the handling device, the opening having edges configured to abut against the handling device.

5. The positioning system according to claim 1, wherein the tray includes immobilising means for immobilising the handling device in the plane of the tray.

6. The positioning system according to claim 5, wherein the tray comprises an opening defining the housing for the handling device, the opening having edges configured to abut against the handling device and wherein the immobilising means include a groove in the edges of the opening.

7. The positioning system according to claim 3, wherein the pins are removable to allow cleaning thereof.

8. The positioning system according to claim 1, wherein at least the positioning elements are of polytetrafluoroethylene.

9. A handling assembly comprising a positioning system according to claim 1 and a handling device comprising a body, a head fitted with a securing face, the head being configured so that the securing face is oriented to the side of the second face of the tray and the body is on the other side of the tray relative to the securing face.

10. The handling assembly according to claim 9, wherein the head of the handling device has dimensions greater than the transverse dimension of the housing, and wherein the head is connected to the body through a joining portion with transverse dimensions less than the transverse dimension of the housing, such that the head can rest on the second face of the tray and the joining portion can slide within the housing.

11. The handling assembly according to claim 9, wherein the handling device comprises at least one channel opening into the securing face and connected to a low pressure source.

12. The handling assembly according to claim 11, wherein the securing face comprises grooves connected to the channel opening.

13. A handling assembly, comprising:
a handling device; and
a positioning system for positioning said handling device relative to a plate of a given shape, said handling device having a securing face to be secured to a face of the plate, said system comprising:
a tray comprising a first face and a second face, the second face being arranged to face at least partly a face of the plate,
a support supporting the tray,
positioning elements for positioning the plate relative to the tray, said positioning elements being carried by the second face of the tray,
a housing for mounting the handling device in the tray, so that said face for securing the handling device is oriented to the side of the second face of the tray, the position of the housing relative to the positioning elements ensuring positioning of the handling device relative to the plate, said housing opening into an external contour of the tray so as to allow the handling device to be placed in the housing and the handling device to be removed from the housing,
wherein said handling device comprises a body, a head fitted with the securing face, the head being configured so that the securing face is oriented to the side of the second face of the tray and the body is on the other side of the tray relative to the securing face,
wherein the handling device comprises at least one channel opening into the securing face and connected to a low pressure source,
wherein the securing face comprises grooves connected to the channel opening, and
wherein the securing face includes first grooves in concentric circles with different diameters and at least one second rectilinear groove disposed radially and crossing the first grooves, said first grooves and said at least second groove being connected to the channel opening.

14. An assembling system for assembling two plates comprising two handling assemblies according to claim 9.

15. The assembling system according to claim 14, wherein said system is configured to assemble two disc-shaped plates each comprising a flat or a notch on its contour, the positioning elements of at least one positioning system being such that they fix the location of the flat or the notch on the tray.

16. A method for assembling a first and a second plate implementing the assembling assembly according to claim 14, including:
Placing the first and second handling devices in the first and second positioning systems respectively,
Placing the first and second plates on the first and second positioning devices respectively,
Securing the first and second plates to the first and second handling devices respectively,
Removing the second handling device and the second plate from the second positioning device,
Bringing the second plate closer to the first plate,
Bringing the first and second plates into contact with each other through their face opposite to that in contact with the first and second handling devices.

17. The positioning system according to claim 1, wherein said positioning elements include pegs or pins extending upwardly from the second face of the tray.

* * * * *